United States Patent
Yang et al.

(10) Patent No.: US 8,736,351 B2
(45) Date of Patent: May 27, 2014

(54) NEGATIVE CHARGE PUMP

(75) Inventors: Tien-Chun Yang, San Jose, CA (US); Yvonne Lin, Saratoga, CA (US); Ming-Chieh Huang, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 216 days.

(21) Appl. No.: 13/005,643

(22) Filed: Jan. 13, 2011

(65) Prior Publication Data

US 2012/0182058 A1  Jul. 19, 2012

(51) Int. Cl.
*G05F 1/10* (2006.01)
*G05F 3/02* (2006.01)

(52) U.S. Cl.
USPC .......................... 327/536; 327/295

(58) Field of Classification Search
USPC ........................ 327/536, 295–297
See application file for complete search history.

(56) References Cited

U.S. PATENT DOCUMENTS

| | | | | |
|---|---|---|---|---|
| 4,933,827 A * | 6/1990 | Olivo et al. | ................... | 363/60 |
| 5,812,018 A * | 9/1998 | Sudo et al. | ................... | 327/537 |
| 5,828,095 A * | 10/1998 | Merritt | ................... | 257/299 |
| 5,877,635 A | 3/1999 | Lin | | |
| 5,939,935 A * | 8/1999 | Merritt | ................... | 327/536 |
| 6,121,822 A * | 9/2000 | Merritt | ................... | 327/536 |
| 6,285,243 B1 * | 9/2001 | Mecier et al. | ................... | 327/536 |
| 6,359,500 B1 * | 3/2002 | Zanuccoli et al. | ................... | 327/536 |
| 6,518,828 B2 * | 2/2003 | Seo et al. | ................... | 327/534 |
| 6,552,397 B1 | 4/2003 | Chi | | |
| 6,566,847 B1 | 5/2003 | Chou et al. | | |
| 6,674,317 B1 | 1/2004 | Chou | | |
| 6,677,806 B2 * | 1/2004 | Bloch | ................... | 327/536 |
| 6,812,773 B1 | 11/2004 | Chou et al. | | |
| 6,864,718 B2 | 3/2005 | Yu | | |
| 7,224,207 B2 | 5/2007 | Chou et al. | | |
| 7,683,698 B2 | 3/2010 | Chu et al. | | |
| 7,755,408 B2 * | 7/2010 | Ehrenreich et al. | ................... | 327/291 |
| 2001/0054928 A1 * | 12/2001 | Mecier et al. | ................... | 327/537 |
| 2004/0164766 A1 | 8/2004 | Yu | | |
| 2004/0217803 A1 | 11/2004 | Chou et al. | | |
| 2005/0264343 A1 * | 12/2005 | Nakamura | ................... | 327/536 |
| 2007/0063761 A1 | 3/2007 | Chou et al. | | |
| 2008/0054990 A1 | 3/2008 | Shieh et al. | | |
| 2009/0051413 A1 | 2/2009 | Chu et al. | | |
| 2010/0246305 A1 | 9/2010 | Yang et al. | | |
| 2010/0253418 A1 | 10/2010 | Ker et al. | | |

OTHER PUBLICATIONS

Huang, M. et al., "A 1.5V Four Phase Switched Polarity Charge Pump", Communications, Circuits and Systems, ICCCAS International Conference Jul. 2009, pp. 688-692.

* cited by examiner

*Primary Examiner* — Quan Tra
(74) *Attorney, Agent, or Firm* — Duane Morris LLP

(57) ABSTRACT

A charge pump includes a first node configured to receive a first voltage and a second node coupled to the first node through a first transistor. The second node is configured to output a voltage having a greater voltage magnitude than the first voltage. A first capacitor is coupled to a third node, and a fourth node is configured to receive a first clock signal. The third node is disposed between a drain of the first transistor and the fourth node. A leaky circuit device is coupled in parallel with the first capacitor for draining charges of a first polarity away from the second node.

4 Claims, 8 Drawing Sheets

NEGATIVE CHARGE PUMP

FIELD OF DISCLOSURE

The disclosed circuits and methods relate to integrated circuits. More specifically, the disclosed circuits and methods relate to charge pumps and clocks for integrated circuits.

BACKGROUND

Charge pumps are a kind of circuit for converting a voltage at an input node into a regulated voltage that is output at an output node, which is typically coupled to a load. Charge pumps enable designers to provide different voltages based on a single power supply voltage. For example, if a circuit needs an operating voltage of a first voltage level, e.g., 1.5 volts, but voltage power supply provides a different voltage level, e.g., −1.5 volts, then a charge pump may be implemented to transform the −1.5 volt voltage provided by the power supply to the 1.5 volts needed to operate the circuit.

However, the response time of conventional charge pumps are limited by the rate at which the capacitors of the charge pump are charged and discharged. Additionally, the timing circuitry that control the operation of conventional charge pumps are complex and require substantial area on a semiconductor substrate.

DETAILED DESCRIPTION

An improved negative charge pump is disclosed that includes a plurality of stages in which at least one of the stages includes a circuit element for reducing a positive voltage build-up in the at least one stage. The addition of the circuit element to at least one stage of the negative charge pump advantageously increases the pumping speed of the charge pump.

Figure 1A:
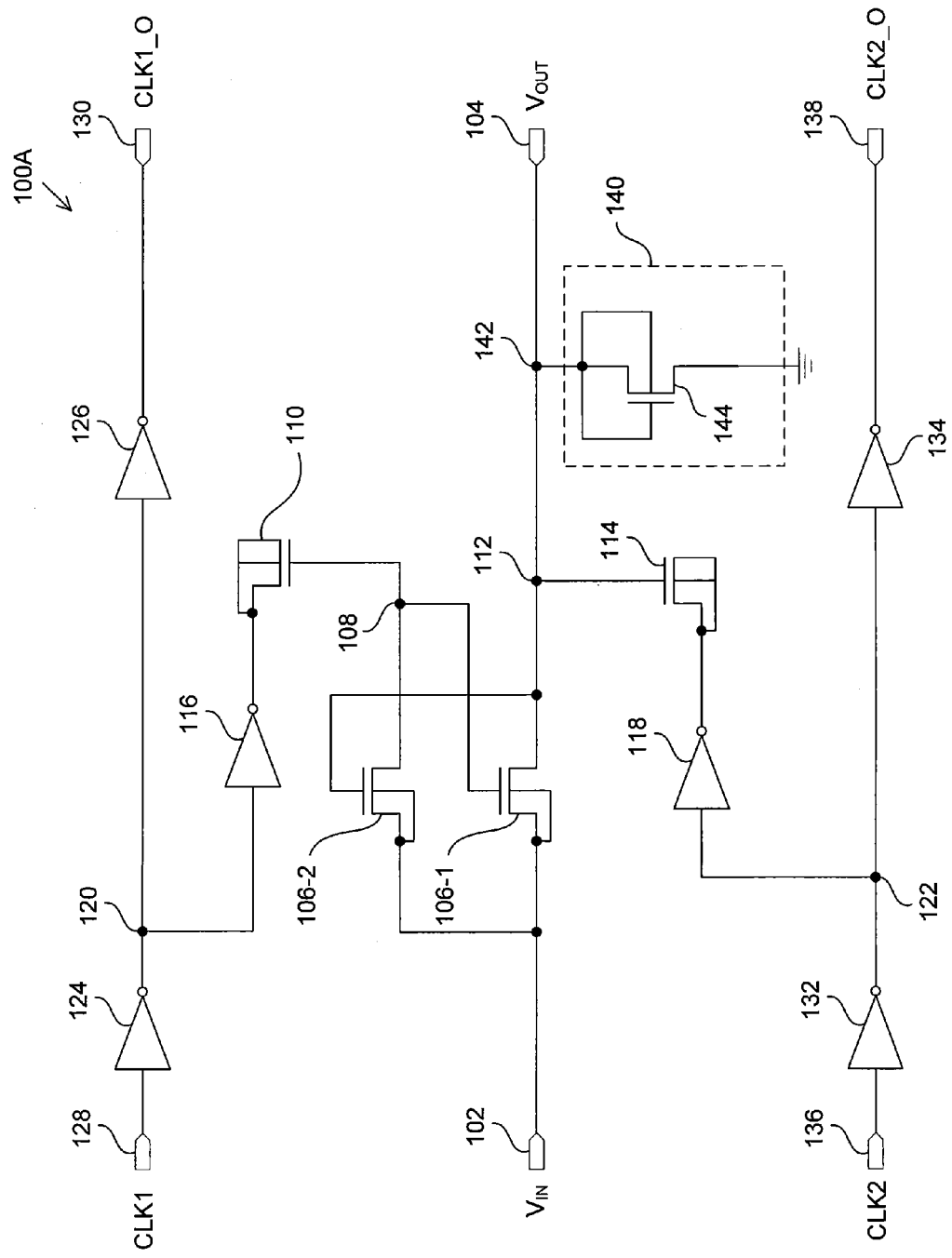
FIG. 1A illustrates one example of an improved charge pump stage.

The improved two-clock charge pump stage 100 illustrated in FIG. 1A includes an input node 102 coupled to an output node 104 through a pair of pass transistors 106-1, 106-2 (collectively referred to as "pass transistors 106"). As shown in FIG. 1A, pass transistor 106-1 has its source coupled to input node 102 and its drain coupled to output node 104, and pass transistor 106-1 has its source coupled to input node 102 and its drain coupled to node 108, which is coupled to capacitor 110 and the gate of pass transistor 106-1. The gate of pass transistor 106-2 is coupled to node 112, which is coupled to the drain of pass transistor 106-1, output node 104, and capacitor 114. Pass transistors 106 are configured such that they act as diodes preventing current from leaking back towards node 102. For example, the source of transistors 106 acts as the anode of a diode and the drain acts as the cathode of a diode to allow current to flow from node 102 to node 104 when forward biased and to prevent current from flowing from node 104 to node 102 when reversed biased.

Capacitors 110 and 114 are respectively coupled to the outputs of inverters 116 and 118 and may be formed by coupling together the source and drain of a metal oxide semiconductor ("MOS") transistor as illustrated in FIG. 1A. The inputs of inverters 116 and 118 are respectively coupled to nodes 120 and 122 with node 120 being coupled to the output of inverter 124 and the input of inverter 126. Inverter 124 receives a first clock input, CLK1, from input node 128 at its input and outputs an inverted clock signal to node 120. Inverter 126 receives the inverted clock signal and outputs the first clock signal CLK1_O to node 130. Node 122 is coupled to the output of inverter 132, which receives a second clock signal, CLK2, at its input from node 136. Inverter 132 outputs an inverted signal of CLK2 to the input of inverter 134, which inverts the inverted clock signal and outputs second clock signal CLK2_O to node 138. In one embodiment, clocks signals CLK1 and CLK2 are approximately 180 degrees out of phase with one another.

Figure 1B:
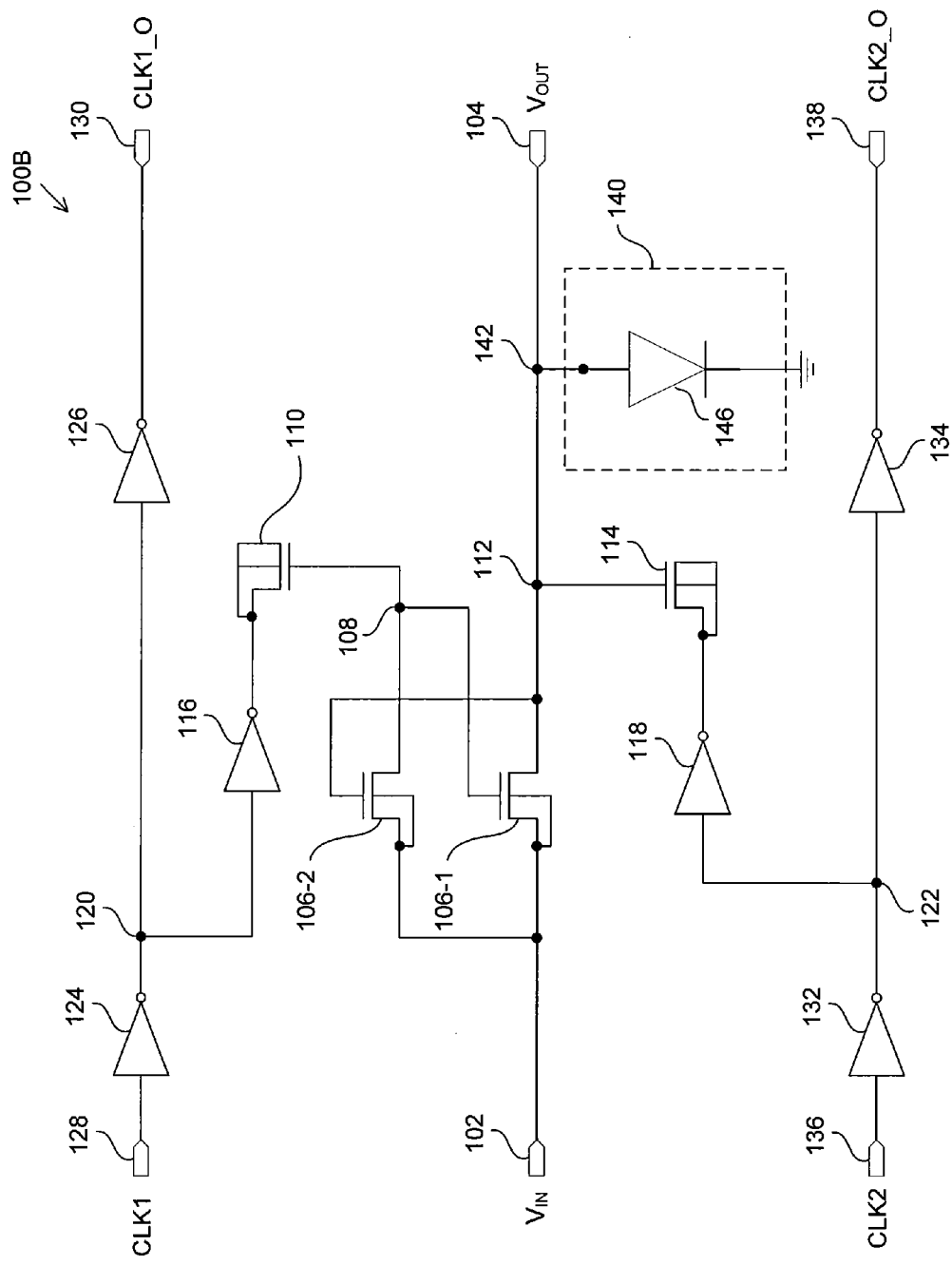
FIG. 1B illustrates another example of an improved charge pump stage.

Two-clock charge pump stage 100 also includes a leaky circuit device 140 coupled to node 142, which is disposed between node 112 and output node 104. In the embodiment illustrated in FIG. 1A, leaky circuit device 140 is implemented as a transistor 144 having its gate coupled to node 142 and its drain coupled to ground. In some embodiments, such as charge pump stage 100B illustrated in FIG. 1B, leaky circuit device 140 may be implemented as a diode 146 having its anode coupled to node 142 and its cathode coupled to ground. Leaky circuit device 140 provides a conduit for draining positive charges that may accumulate at nodes 112 and 142 to ground. Reducing the amount of positive charges accumulating at nodes 112 and 142 increases the pumping speed of a charge pump.

Figure 2:
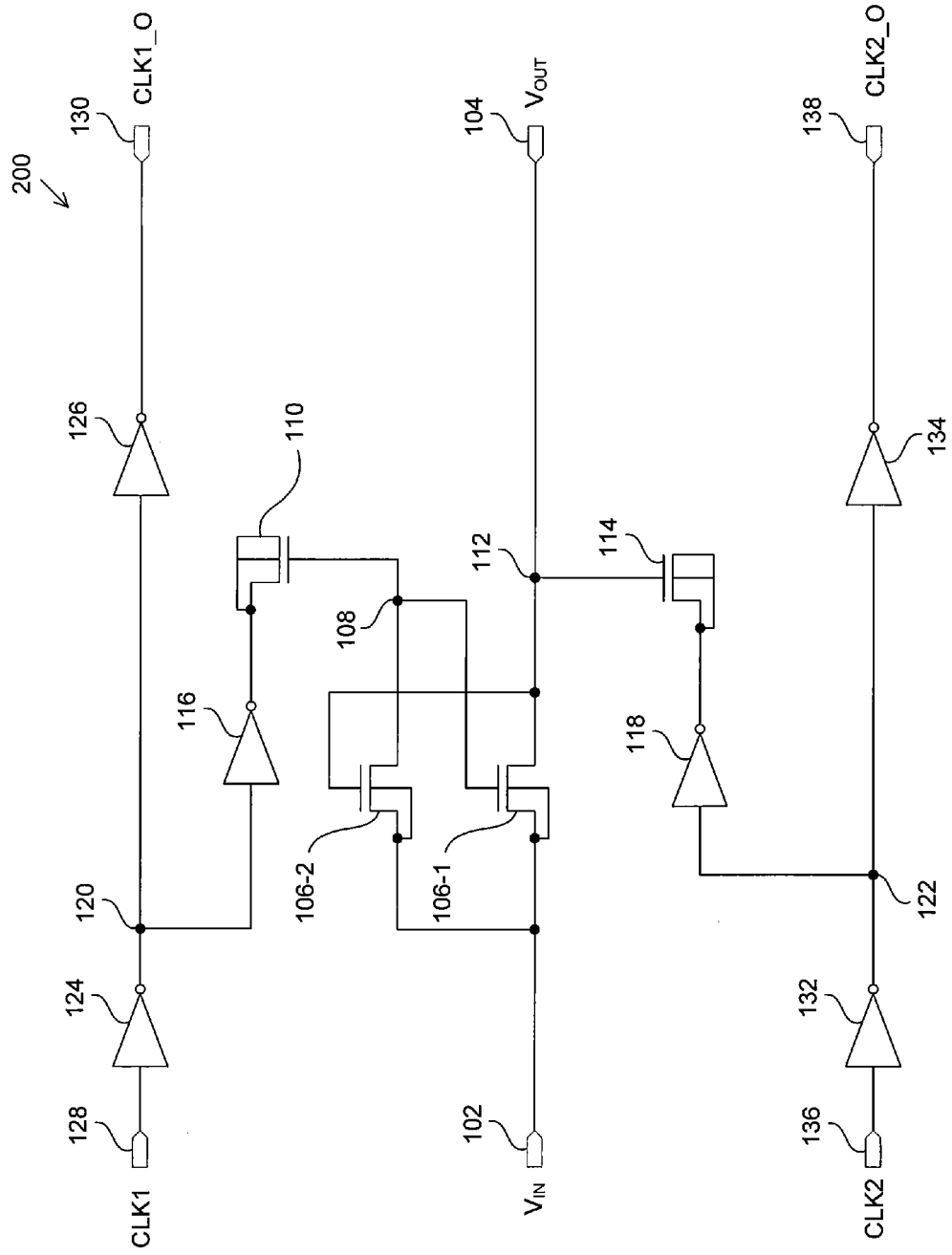
FIG. 2 illustrates another example of a charge pump stage.

Two-clock charge pump stage 200 illustrated in FIG. 2 is similar to the charge pumping stage 100 illustrated in FIG. 1 except that the two-clock charge pump stage 200 in FIG. 2 does not include a leaky circuit device 140.

Figure 3:
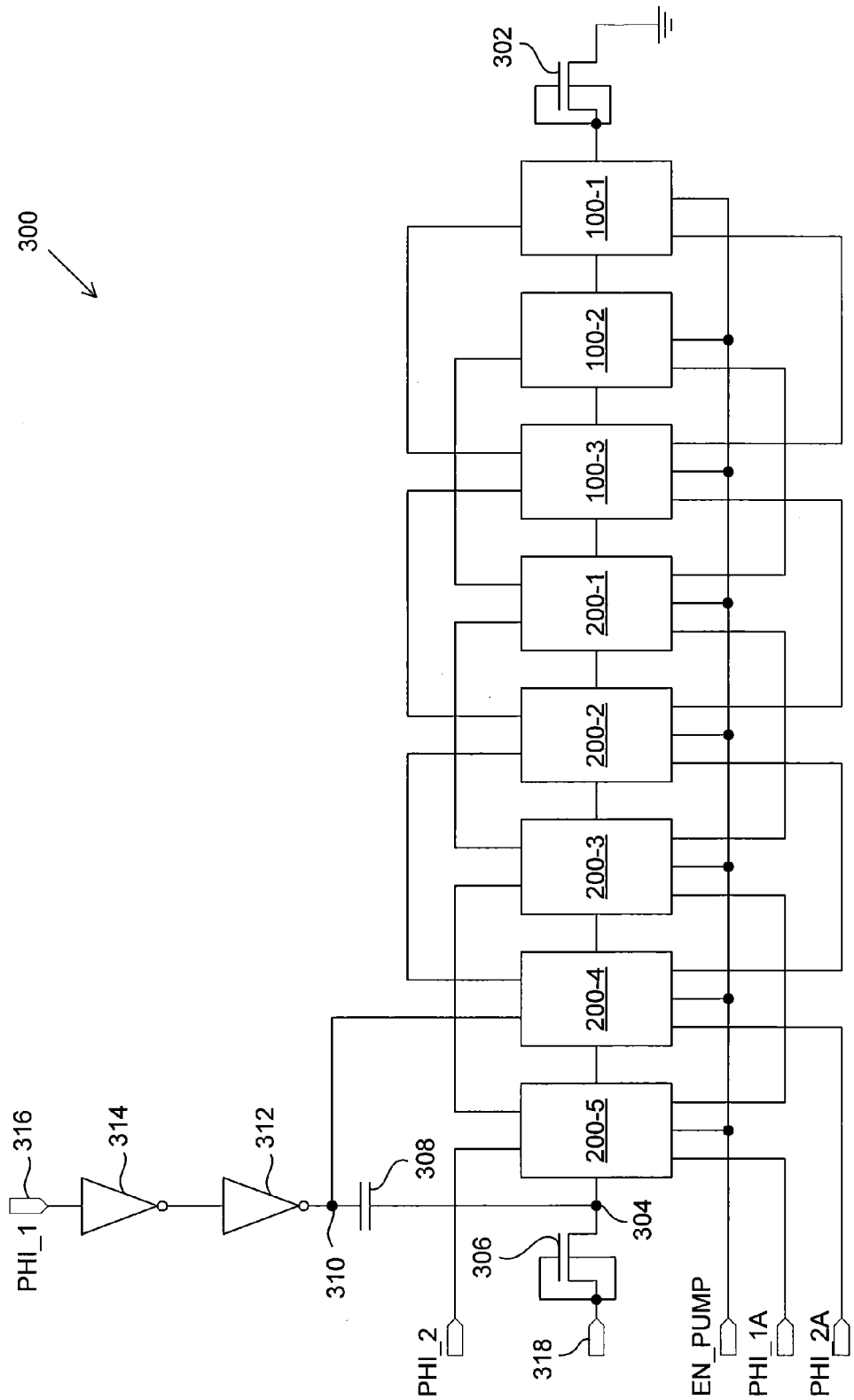
FIG. 3 illustrates one example of a negative charge pump including a plurality of charge pump stages in accordance with FIGS. 1 and 2.

Charge pump stages 100 (e.g., stage 100A, 100B) and 200 may be coupled together to provide an improved charge pump 300 such as the charge pump illustrated in FIG. 3. Although FIG. 3 illustrates a charge pump that includes eight stages each having two-clocks, one skilled in the art will understand that charge pump 300 may include fewer or more stages with each stage comprising fewer or more than two clocks. As shown in FIG. 3, charge pump 300 includes a transistor 302 having its drain coupled to ground and its gate and source coupled to the output node 104 of a first charge pump stage 100-1. The input node 102 of first charge pump stage 100-1 is coupled to output node 104 of second charge pump stage 100-2, and the input node 102 of second charge pump stage 100-2 is coupled to output node 104 of third charge pump stage 100-3. In this manner, each of the plurality of charge pump stages 100, 200 are coupled together.

The output node 104 of the eighth charge pump stage 200-5 is coupled to node 304, which is coupled to the drain of pass transistor 306 and to capacitor 308. Capacitor 308 is coupled to node 310, which is also coupled to the output of 312 and provides a first clock signal PHI_1 to node 128 of charge pump stage 200-4. The input of inverter 312 is coupled to the output of inverter 314, which receives the clock signal PHI_1 at its input from node 316. Transistor 306 has its gate coupled to its drain, which is coupled to output node 318 for providing a negative voltage.

Node 130 of charge pump stage 200-4 is coupled to node 128 of clock pump stage 200-2, node 130 of charge pump stage 200-2 is coupled to node 128 of charge pump stage 100-3, and node 130 of charge pump stage 100-3 is coupled to node 128 of charge pump stage 100-1. In this manner, charge pump stages 200-4, 200-2, 100-3, and 100-1 receive first clock signal PHI_1. Similarly, charge pump stage 200-4 receives a second clock signal PHI_2A at node 136 and outputs second clock signal PHI_2A at node 138, which is received at node 136 of charge pump stage 200-2. Charge pump stage 200-2 outputs second clock signal PHI_2A at node 138, which is received at node 136 of charge pump stage 100-3. Charge pump stage 100-1 receives signal PHI_2A at node 136 from node 100-3 of charge pump stage 100-3.

Charge pump stages 200-5, 200-3, 200-1, and 100-2 receive a third clock signal PHI_2 at their respective nodes 128 in a similar manner as charge pump stages 200-4, 200-2, 100-3, and 100-1 receive clock signal PHI_1. For example, charge pump stage 200-3 receives signal PHI_2 at node 126 from node 130 of charge pump stage 200-5, charge pump stage 200-1 receives signal PHI_2 at node 126 from node 130 of charge pump stage 200-3, and charge pump stage 100-2 receives signal PHI_2 at node 126 from node 130 of charge pump stage 200-1. A fourth clock signal PHI_1A is provided to nodes 136 of charge pump stages 200-5, 200-3, 200-1, and 100-2 with charge pump stage 200-3 receiving signal PHI_1A at node 136 from node 138 of charge pump stage 200-5, charge pump stage 200-1 receiving signal PHI_1A at node 136 from node 138 of charge pump stage 200-3, and charge pump stage 100-2 receiving signal PHI_1A at node 136 from node 138 of charge pump stage 200-1. A pump control or enable signal, EN_PUMP, may also be provided to each of the charge pump stages 100, 200.

Figure 4:
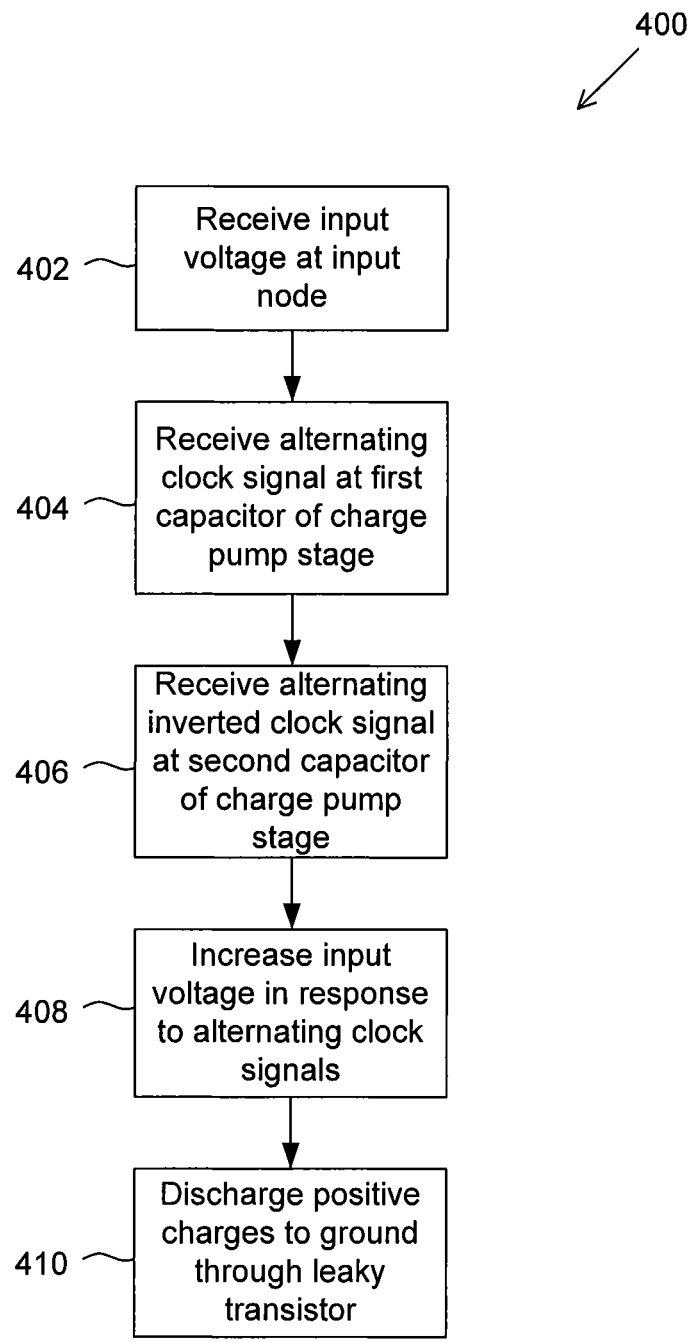
FIG. 4 is a flow diagram of one example of a method of operation of a charge pump in accordance with FIG. 3.

The operation of charge pump 300 is described with reference to FIGS. 1-4 in which FIG. 4 is a flow diagram of the operation of a two-clock charge pump stage in accordance with FIG. 1. Each of the charge pump stages 100, 200 of multi-stage charge pump 300 increases the voltage from an input node 102 to the output node 104 of the respective stage by the charging and discharging capacitors 110 and 114. For example and referring to FIGS. 1 and 4, an input voltage VIN is received at node 102 at block 402. At blocks 404 and 406, a first clock signal is received at node 128 and a second clock signal, which is the inverse of the first clock signal, is received at node 136, respectively. When the clock signal received at node 128 goes low after being high, then the voltage at node 108, which is coupled to the gate of transistor 106-1, goes low such that transistor 106-1 is not in a current conducting state as the charge stored in capacitor 110 flows through transistor 106-2 thereby increasing the voltage at the source of transistor 106-1 in response to node 136 going high after being low to turn on transistor 106-2.

When the clock signal at node 128 changes from a logic low to a logic high, then the clock signal at node 136 changes from a logic high to a logic low resulting in transistor 106-1 changing from a non-current-conducting state to a current-conducting state and transistor 106-2 changes from a current-conducting state to a non-current-conducting state. Consequently, the charge that accumulated at the source of transistor 106-1 flows through transistor 106-1 to node 104, which is the output node of the charge pump stage thereby increasing the input voltage in response to the alternating clock signals at block 408. The constant switching on and off of transistors 106 prevents current from flowing back towards node 102 such that transistors 106 perform as diodes.

Each of the stages 100, 200 of the multi-stage charge pump 300 illustrated in FIG. 3 increase the voltage from nodes 102 to 104 as set forth above with reference to blocks 402-408 of FIG. 4. In some embodiments, the voltage increase across a charge pump stage 100, 200 is approximately one-half the operating voltage of the circuit, $V_{DD}$, assuming a 50 percent clock duty cycle, but may vary depending on the clock duty cycle as will be understood by one skilled in the art. For example, assuming $V_{DD}$ of each pump stage 100, 200 in FIG. 3 is approximately 3.3 volts, then each charge pump stage 100, 200 increases the voltage by approximately 1.5 volts (approximately 0.6 volts per capacitor 110, 114) such that the voltage at node 318 is approximately −12 volts since the output node 104 of charge pump stage 100-1 is fixed at ground.

Figure 5:
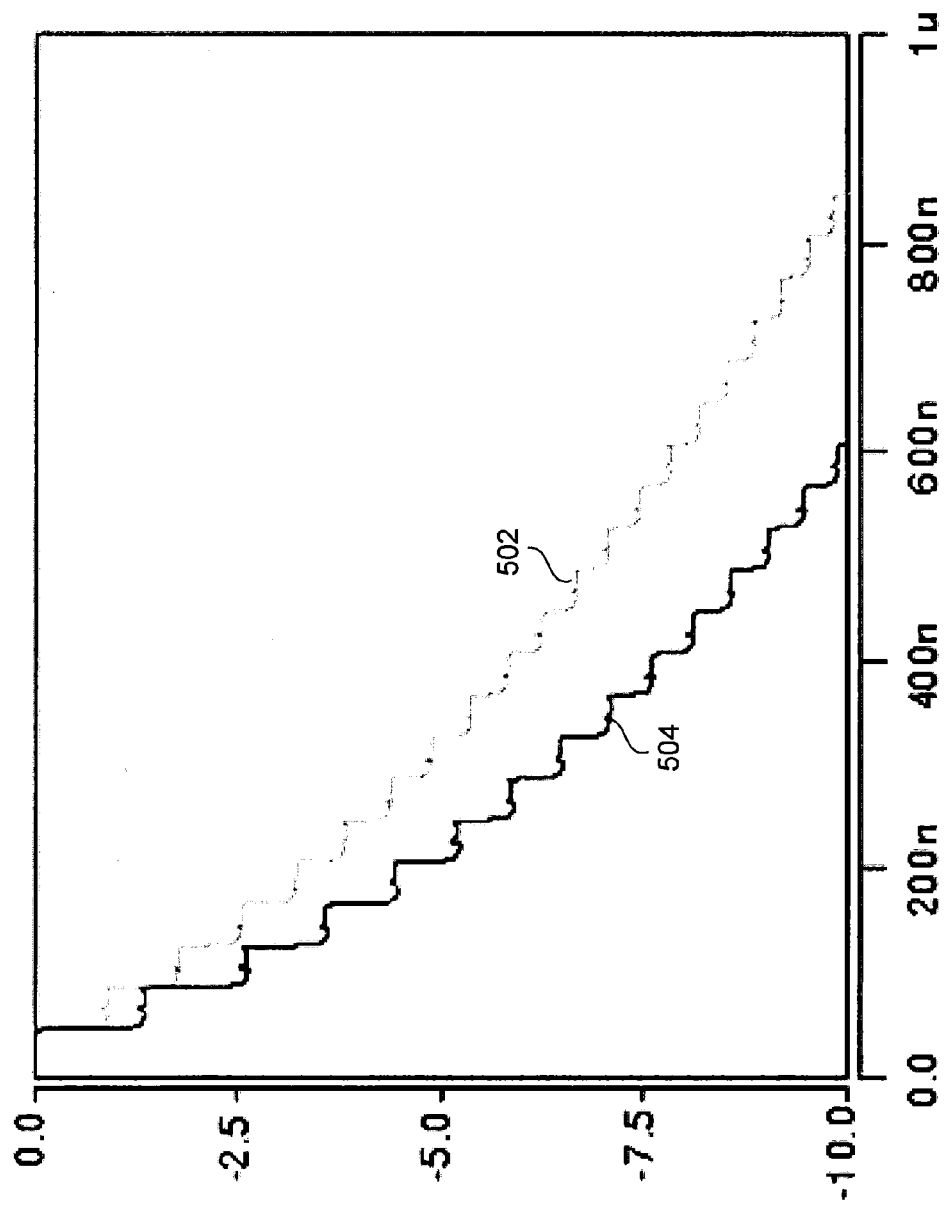
FIG. 5 is a voltage versus time graph illustrating the difference between a conventional negative charge pump and an improved charge pump in accordance with one embodiment.

However, during the operation of charge pump 300, positive charges may accumulate between stages 100-3, 100-2, 100-1, which results in the speed at which charge pump 300 pulls down the voltage to increase. At block 410, leaky circuit device 140 coupled to node 142 drains positive charges that may accumulated at node 112 to ground. In embodiments in which charge pump stage 100 is incorporated in a charge pump stage, leaky circuit device 140 may be configured to drain charges of an opposite polarity, i.e., negative charges, from node 142. The inclusion of leaky circuit device 140 increases the operation speed (speed at which a negative or positive voltage is generated) of charge pump 300 as illustrated in FIG. 5, which is a voltage versus time graph comparing the time it takes a negative charge pump that does not include leaky transistors (trace 502) to output a voltage of −10 volts to an improved charge pump in accordance with FIG. 3 (trace 504) to output a voltage of −10 volts. As shown in FIG. 5, the improved charge pump in accordance with the present disclosure operates approximately 250 ns faster than a conventional charge pump. Consequently, the improved charge pump disclosed herein advantageously enables an increase in pumping speeds by approximately 20-30 percent compared to conventional charge pumps.

Figure 6:
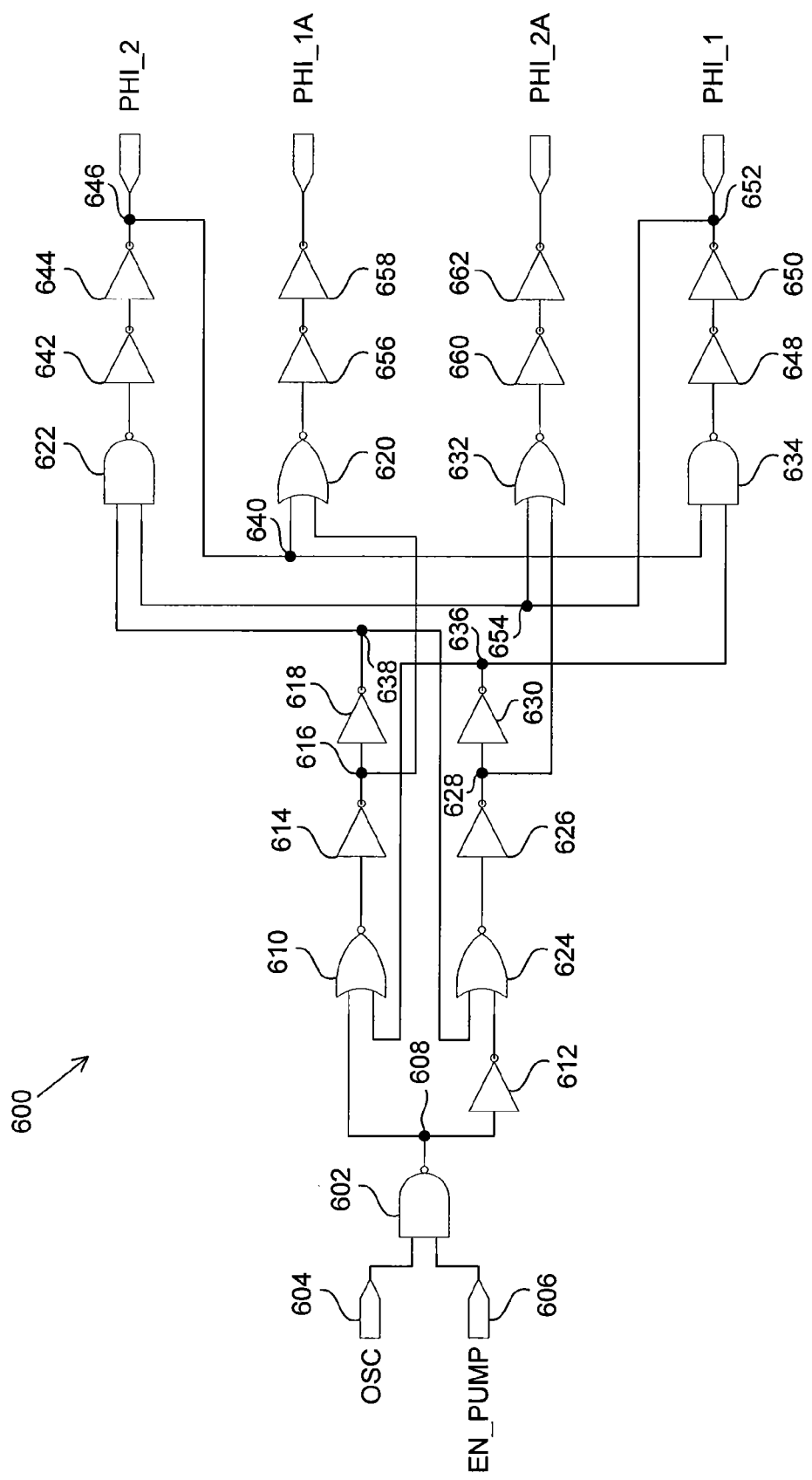
FIG. 6 illustrates one example of a four-phase clock circuit.

In some embodiments, the four clock signals PHI_1, PHI_1A, PHI_2, and PHI_2A provided to charge pump 300 may be provided from a four-phase non-overlapping clock generator such as the clock generator 600 illustrated in FIG. 6. As shown in FIG. 6, clock generator 600 includes a two-input NAND gate 602 having a first input coupled to node 604 that receives an input signal, OSC, from an oscillator or crystal (not shown) and a second input that receives the charge pump enable signal, EN_PUMP from node 606. The output of NAND gate 602 is coupled to node 608, which is coupled to a first input of NOR gate 610 and the input of inverter 612.

The output of NOR gate 610 is coupled to an input of inverter 614, which has an output coupled to node 616. Node 616 is coupled to the input of inverter 618 and the input of NOR gate 620. The output of inverter 618 is coupled to an input of NAND gate 622. The second input of NAND gate 622 is coupled to an input of NOR gate 624, which has a second input that receives the output of inverter 612. The output of NOR gate 624 is coupled to an input of inverter 626 having an output coupled to node 628. Node 628 is coupled to the input of inverter 630 and an input of NOR gate 632. The output of inverter 630 is coupled to an input of NOR gate 610 and an input of NAND gate 634 via node 636. Similarly, the output of inverter 618 is coupled to the input of NOR gate 624 and an input of NAND gate 622 via node 638.

The second input of NAND gate 634 is coupled to a second input of NOR gate 620 via node 640 and to the output of inverter 644 at node 646, which provides the signal PHI_2. The input of inverter 644 is coupled to the output of inverter 642, which is coupled to the output of NAND gate 642. Like NAND gate 622, the output of NAND gate 634 is coupled through a pair of inverters 648, 650 to node 652, which outputs signal PHI_1. Node 652 is also coupled to node 654, which is coupled to an input of NOR gate 632 and an input of NAND gate 622.

The output of NOR gate 620 is coupled through a pair of inverters 656, 658 to provide signal PHI_1A, and the output of NOR gate 632 is coupled through a pair of inverters 660, 662 to provide signal PHI_2A. Although two inverters are shown being coupled to the output of NAND gates 622, 634 and NOR gates 620, 632, one skilled in the art that fewer or more inverters may be implemented.

In operation, an oscillating signal, OSC, is received at node 604 from a crystal oscillator or other device and an enable pump signal EN_PUMP is received at node 606. When both OSC and EN_PUMP are logic "1" or "high" signals, the output of NAND gate 602 is a logic "0" or "low" signals. For all other combinations of OSC and EN_PUMP, the output of NAND gate 602 is a logic high.

The output of NAND gate 602 is supplied to both NOR gates 610 and 624 with NOR gate 624 receiving an inverted signal from inverter 612. When the inputs of NOR gate 610 (i.e., node 608 and node 636) and NOR gate 624 (i.e., the output of inverter 612 and node 638) are both logic low, then the output of NOR gates 610 and 624 are logic high. The outputs of NOR gates 610 and 624 are logic low for all other combinations of input signals. The output of NOR gates 610 and 624 each pass through a pair of inverters such that the signals take on a square shape at nodes 638 and 636, respectively. Inverter 612 coupled to the input of NOR gate 624 results in the logic state of node 636 being opposite the logic stage of node 628 and the logic stage of node 616 being opposite node 628.

NAND gate 622 receives input signals from node 638 and node 652, which is the clock signal PHI_1, and provides a logic low output when the inputs are both logic high. The output of NAND gate 622 is a logic high for all other combinations at the input of NAND gate 622. Inverters 642 and 644 further develop the output of NAND gate 622 to have a square shape. Additional inverters may be coupled to the output of NAND gate 622 to further create a square output signal at node 646, which is clock signal PHI_2. NAND gate 634 receives input signals from node 636, which has an opposite logic state as node 638 at the same time, and from node 646, which is the clock signal PHI_2, and provides a logic low output when the inputs are both logic high. For all other combinations at the inputs of NAND gate 634, the output of NAND gate 634 is a logic high.

NOR gate 620 also receives clock signal PHI_2 at one input and the logic state at node 616 at its other input and outputs a logic high signal when both inputs are low. The output of NOR gate 620 is low for all other combinations of inputs. NOR gate 632 receives clock signal PHI_1 at one input, which is opposite clock signal PHI_2, and the logic stage at node 628, which is opposite the logic state of node 616 at the same time, at its other input. Like NOR gate 620, the NOR gate 632 outputs a logic high signal when both of its inputs are low and outputs a logic low signal for all other combinations of inputs.

Figure 7:
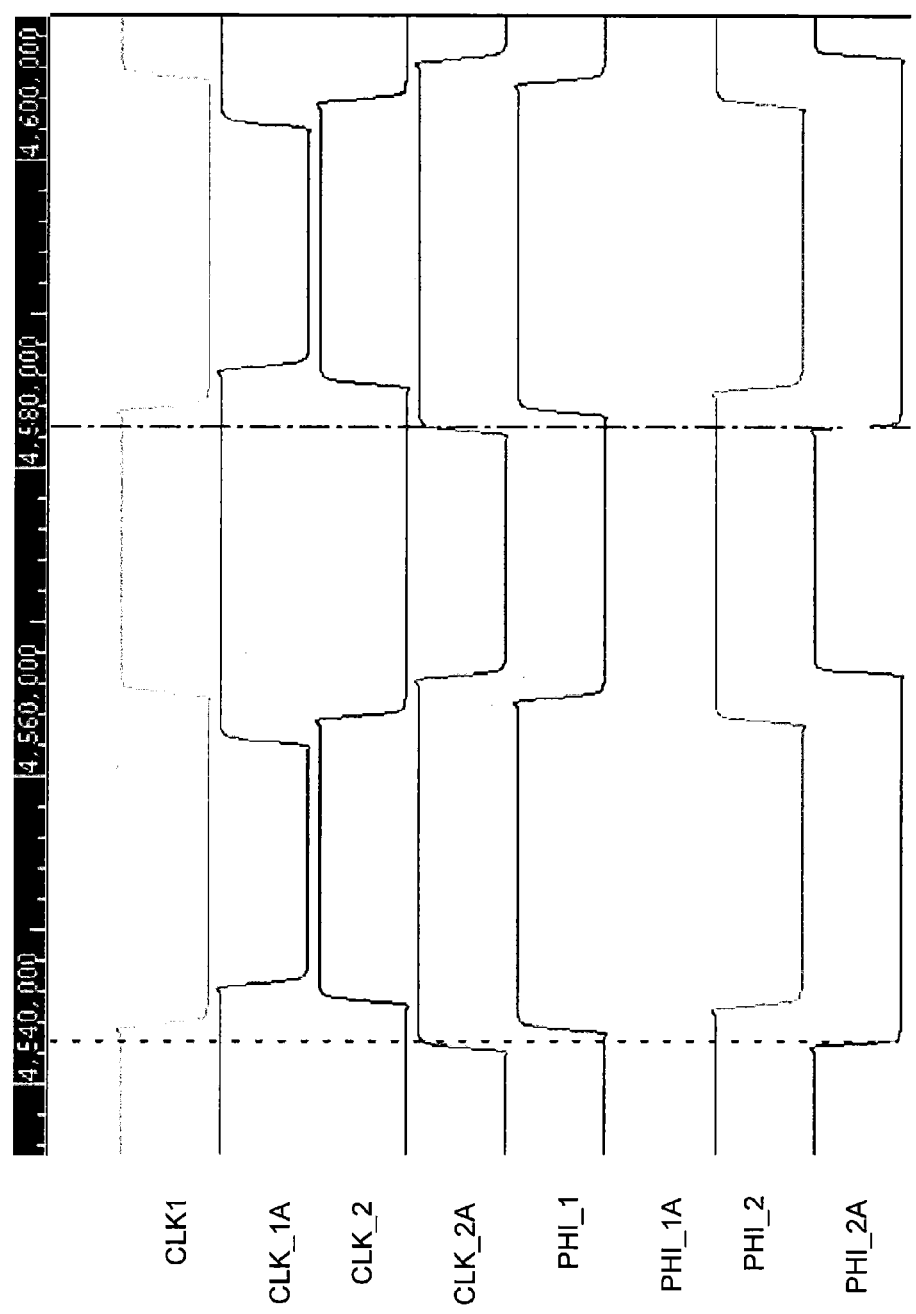
FIG. 7 is a timing diagram of various signals of the four-phase clock circuit illustrated in FIG. 6.

FIG. 7 is one example of a timing diagram of the outputs PHI_1, PHI_1A, PHI_2, and PHI_2A of a four-phase clock generator in accordance with FIG. 6. As shown in FIG. 7, when clock signals PHI_1 and PHI_2A are approximately 180 degrees out of phase with one another as are clock signals PHI_1A and PHI_2. Clock signal PHI_1 is high for a longer period of time than it is low and is high longer than clock signal PHI_1A. In a similar manner clock signal PHI_2A is logic low for a longer period of time than it is a logic high and for a longer period of time than PHI_2 is logic low. In some embodiments, clock signal PHI_1 is high and clock signal PHI_2A is low for approximately 55-65 percent of a single period and clock signal PHI_1A is high and clock signal PHI_2 is low for approximately 45-35 percent of a single period although one skilled in the art will understand that clock signals PHI_1, PHI_1A, PHI_2, and PHI_2A may be high for shorter or longer portions of a single period.

The four-phase clocks disclosed herein advantageously have a smaller footprint than conventional four-phase clocks. Additionally, the four-phase clock disclosed herein have reduced power consumption compared to conventional clocks.

In some embodiments, a charge pump includes a first node configured to receive a first voltage and a second node coupled to the first node through a first transistor. The second node is configured to output a voltage having a greater voltage magnitude than the first voltage. A first capacitor is coupled to a third node, and a fourth node is configured to receive a first clock signal. The third node is disposed between a drain of the first transistor and the fourth node. A leaky circuit device is coupled in parallel with the first capacitor for draining charges of a first polarity away from the second node.

In some embodiments, a method includes receiving a first voltage at a source of a first transistor and at a source of a second transistor of a charge pump, applying a first periodic clock signal to a first capacitor coupled in parallel with a drain of the first transistor to increase the first voltage, and applying a second periodic clock signal that is out of phase with the first periodic clock signal to a gate of the first transistor through a second capacitor to alternately turn on and off the first transistor to further increase the first voltage. Charges of a first polarity accumulated at a node disposed between the drain of the first transistor and an output node of the charge pump are discharged.

In some embodiments, a circuit includes a four-phase non-overlapping clock generator. The clock generator includes a first NAND gate configured to receive an oscillating signal at a first input and a control signal at a second input. First and second NOR gates are disposed in parallel with one another. The first NOR gate is configured to receive a signal output from the first NAND gate at a third input and a signal output from the second NOR gate at a fourth input. The second NOR gate is configured to receive the signal output from the first NAND gate through an inverter at a fifth input and a signal output from the first NOR gate at a sixth input. Second and third NAND gates are disposed in parallel with one another. The second NAND gate is configured to receive the signal output from the first NOR gate at a seventh input and a signal output from the third NAND gate at an eighth input. The third NAND gate is configured to receive the signal output from the second NOR gate at a ninth input and a signal output from the second NAND gate at a tenth input. Third and fourth NOR gates are disposed in parallel with each other and with the second and third NAND gates. The third NOR gate is configured to receive the output of the first NOR gate through a second inverter at an eleventh input and the output of the second NAND gate at a twelfth input. The fourth NOR gate is configured to receive the output of the second NOR gate through a third inverter at a thirteenth input and the output of the third NAND gate at a fourteenth input. The output of the second NAND gate is a first clock signal, an output of the third NOR gate is a second clock signal, an output of the fourth NOR gate is a third clock signal, and the output of the third NAND gate is a fourth clock signal.

Although the disclosed circuits and methods have been described in terms of exemplary embodiments, they are not limited thereto. Rather, the appended claims should be construed broadly, to include other variants and embodiments of the disclosed circuits and methods, which may be made by those skilled in the art without departing from the scope and range of equivalents of the disclosed circuits and methods.

What is claimed is:

1. A circuit, comprising:
   a four-phase non-overlapping clock generator including:
   a first NAND gate configured to receive an oscillating signal at a first input and a control signal at a second input;
   first and second NOR gates disposed in parallel, with one another, the first NOR gate configured to receive a signal output from the first NAND gate at a third input and a signal output from the second NOR gate at a fourth input, the second NOR gate configured to receive the signal output from the first NAND gate through an inverter at a fifth input and a signal output from the first NOR gate at a sixth input;
   second and third NAND gates disposed in parallel with one another, the second NAND gate configured to receive the signal output from the first NOR gate at a seventh input and a signal output from the third NAND gate at an eighth input, the third NAND gate configured to receive the signal output from the second NOR gate at a ninth input and a signal output from the second NAND gate at a tenth input; and
   third and fourth NOR gates disposed in parallel with each other and with the second and third NAND gates, the third NOR gate configured to receive the output of the first NOR gate through a second inverter at an eleventh input and the output of the second NAND gate at a twelfth input, the fourth NOR gate configured to receive the output of the second NOR gate through a third inverter at a thirteenth input and the output of the third NAND gate at a fourteenth input,
   wherein the output of the second NAND gate is a first clock signal, an output of the third NOR gate is a second clock signal, an output of the fourth NOR gate is a third clock signal, and the output of the third NAND gate is a fourth clock signal,
   wherein the first, second, third, and fourth clock signals are provided to a charge pump including:
   a first node configured to receive a first voltage;
   a second node coupled to the first node through a first transistor and configured to output a voltage having a different voltage potential than the first voltage;
   a first capacitor coupled to a third node disposed between a drain of the first transistor and to a fourth node configured to receive the first clock signal;
   a second capacitor coupled to the first node through a second transistor and to a fifth node configured to receive the fourth clock signal, the second transistor having a source coupled to the first node and a gate coupled to the third node;
   a third capacitor coupled to the first node and to a sixth node configured to receive the second clock signal;
   a third transistor having a drain coupled to the first node for outputting the first voltage and a source coupled to a seventh node configured to receive a third voltage having a different voltage potential than the potential of the first voltage;
   a fourth capacitor coupled to the seventh node through a fourth transistor and configured to receive the third clock signal; and
   a leaky circuit device coupled in parallel with the first capacitor for draining positive charges away from the second node, the leaky circuit device including a transistor arranged as a diode coupled in parallel with the first capacitor such that a drain of the transistor is directly coupled to ground.

2. The circuit of claim 1, wherein the first clock signal is approximately 180 degrees out of phase with the fourth clock signal and the second clock signal is approximately 180 degrees out of phase with the third clock signal.

3. A method, comprising:
   receiving an oscillating signal and a control signal at respective inputs of a first NAND gate;
   receiving a signal output from the first NAND gate through a first inverter and a signal output from a second NOR gate at respective inputs of a first NOR gate that is disposed in parallel with the second NOR gate;
   outputting a second clock signal from a second NAND gate that is disposed in parallel with a third NAND gate in response to receiving a signal output from the first NOR gate and a signal output from the third NAND gate;
   outputting a first clock signal from the third NAND gate in response to receiving a signal output from the second NOR gate and a signal output from the second NAND gate;
   outputting a third clock signal from a third NOR gate that is disposed in parallel with a fourth NOR gate in response to receiving a signal output from the first NOR gate through a second inverter and a signal output from the second NAND gate;
   outputting a fourth clock signal from the fourth NOR gate in response to receiving a signal output from the second NOR gate through a third inverter and a signal output from the third NAND gate;
   receiving the first and third clock signals at a first stage of a charge pump; and
   receiving the second and fourth clock signals at a second stage of the charge pump,
   wherein the first stage of the charge pump includes:
   a first node connected to a source of a first transistor and to a source of a second transistor;
   a second node connected to a drain of the second transistor and to a gate of the first transistor, the second node having a voltage that is different from a voltage of the first node;
   a first capacitor connected to the second node and to an output of a fourth inverter configured to receive a first inverted clock signal output from a fifth inverter that receives the first clock signal;
   a second capacitor connected to a drain of the first transistor, a gate of the second transistor, and to an output of a sixth inverter configured to receive a second inverted clock signal output from a seventh inverter that is configured to receive the third clock signal; and
   a leaky circuit device connected to the second node and to ground, wherein the leaky circuit device includes a third transistor arranged as a diode and having a drain directly coupled to ground.

4. The method of claim 3, wherein the second stage of the charge pump includes:
   a third node connected to the second node, a source of a fourth transistor, and a source of a fifth transistor;

a fourth node connected to a drain of the fourth transistor and to a gate of the fifth transistor, the fourth node having a voltage that is different from a voltage of the third node;

a third capacitor connected to the fourth node and to an output of an eighth inverter configured to receive a third inverted clock signal output from a ninth inverter that is configured to receive the second clock signal;

a fourth capacitor connected to the fourth node and to an output of a tenth inverter configured to receive a fourth inverted clock signal output from an eleventh inverter that is configured to receive the fourth clock signal; and a leaky circuit device connected to the fourth node and to ground, wherein the leaky circuit device includes a sixth transistor arranged as a diode and having a drain directly coupled to ground.

* * * * *

UNITED STATES PATENT AND TRADEMARK OFFICE
CERTIFICATE OF CORRECTION

| | | |
|---|---|---|
| PATENT NO. | : 8,736,351 B2 | Page 1 of 1 |
| APPLICATION NO. | : 13/005643 | |
| DATED | : May 27, 2014 | |
| INVENTOR(S) | : Tien-Chun Yang et al. | |

It is certified that error appears in the above-identified patent and that said Letters Patent is hereby corrected as shown below:

In the Claims:

Claim 1, Column 7, Line 17 – delete "parallel," and insert -- parallel --.

Signed and Sealed this
Twenty-third Day of June, 2015

Michelle K. Lee
*Director of the United States Patent and Trademark Office*